(12) United States Patent
Mutch et al.

(10) Patent No.: US 12,057,472 B2
(45) Date of Patent: Aug. 6, 2024

(54) DEVICES COMPRISING CRYSTALLINE MATERIALS

(71) Applicant: Micron Technology, Inc., Boise, ID (US)

(72) Inventors: Michael Mutch, Chardon, OH (US); Manuj Nahar, Boise, ID (US); Wayne I. Kinney, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/050,772

(22) Filed: Oct. 28, 2022

(65) Prior Publication Data

US 2023/0074063 A1 Mar. 9, 2023

Related U.S. Application Data

(60) Continuation of application No. 16/898,029, filed on Jun. 10, 2020, now Pat. No. 11,532,699, which is a division of application No. 16/121,966, filed on Sep. 5, 2018, now Pat. No. 10,707,298.

(51) Int. Cl.
*H01L 29/04* (2006.01)
*H01L 21/02* (2006.01)
*H01L 21/324* (2006.01)
*H01L 29/161* (2006.01)
(Continued)

(52) U.S. Cl.
CPC ........ *H01L 29/04* (2013.01); *H01L 21/02532* (2013.01); *H01L 21/02667* (2013.01); *H01L 21/324* (2013.01); *H01L 29/161* (2013.01); *H01L 27/105* (2013.01); *H01L 29/78642* (2013.01)

(58) Field of Classification Search
None
See application file for complete search history.

(56) References Cited

U.S. PATENT DOCUMENTS

| 3,966,513 A | 6/1976 | Hallais et al. |
| 4,767,585 A | 8/1988 | Holm et al. |
| 5,214,296 A | 5/1993 | Nakata et al. |

(Continued)

FOREIGN PATENT DOCUMENTS

| CN | 1442740 A | 9/2003 |
| CN | 1495848 A | 5/2004 |

(Continued)

OTHER PUBLICATIONS

Chinese First Office Action for Chinese Application No. 201910833310.4, dated Feb. 7, 2023, 13 pages with translation.

*Primary Examiner* — Long Pham
(74) *Attorney, Agent, or Firm* — TraskBritt (57) ABSTRACT

A method includes forming a semiconductor structure. The structure includes a first material, a blocking material, a second material in an amorphous form, and a third material in an amorphous form. The blocking material is disposed between the first material and the second material. At least the second material and the third material each comprise silicon and/or germanium. The structure is exposed to a temperature above a crystallization temperature of the third material and below a crystallization temperature of the second material. Semiconductor structures, memory devices, and systems are also disclosed.

19 Claims, 6 Drawing Sheets

(51) Int. Cl.
*H01L 27/105* (2023.01)
*H01L 29/786* (2006.01)

(56) References Cited

U.S. PATENT DOCUMENTS

| | | | |
|---|---|---|---|
| 5,471,331 A | 11/1995 | Takizawa et al. | |
| 5,543,187 A | 8/1996 | Errico et al. | |
| 5,612,230 A | 3/1997 | Yuzurihara et al. | |
| 6,080,998 A | 6/2000 | Shima et al. | |
| 6,326,248 B1 | 12/2001 | Ohtani et al. | |
| 6,737,307 B2 | 5/2004 | Tsai et al. | |
| 6,974,763 B1 | 12/2005 | Zhang et al. | |
| 7,029,995 B2 * | 4/2006 | Todd | H01L 21/0262 438/481 |
| 7,304,328 B2 * | 12/2007 | Bedell | H01L 21/76243 257/E33.009 |
| 7,501,331 B2 | 3/2009 | Herner | |
| 7,563,670 B2 | 7/2009 | Cheng et al. | |
| 8,062,963 B1 | 11/2011 | Van Dal | |
| 9,252,191 B2 | 2/2016 | Clark et al. | |
| 9,876,018 B2 | 1/2018 | Chavan et al. | |
| 2002/0066870 A1 | 6/2002 | Koba | |
| 2005/0130424 A1 * | 6/2005 | Bedell | H01L 21/76243 438/689 |
| 2006/0030133 A1 * | 2/2006 | Agnello | H01L 21/7624 438/509 |
| 2006/0208257 A1 | 9/2006 | Branz et al. | |
| 2007/0123062 A1 | 5/2007 | Kang et al. | |
| 2008/0057639 A1 | 3/2008 | Sandhu et al. | |
| 2008/0135875 A1 * | 6/2008 | Agnello | H01L 21/02532 257/190 |
| 2008/0153214 A1 | 6/2008 | Jung et al. | |
| 2008/0182392 A1 | 7/2008 | Yeh et al. | |
| 2009/0176354 A1 | 7/2009 | Rajendran et al. | |
| 2009/0246460 A1 | 10/2009 | Cho et al. | |
| 2010/0078729 A1 | 4/2010 | Fukutome et al. | |
| 2013/0207226 A1 | 8/2013 | Adam et al. | |
| 2014/0264348 A1 | 9/2014 | Tsai et al. | |
| 2015/0159295 A1 | 6/2015 | Takahashi et al. | |
| 2015/0190785 A1 | 7/2015 | Mao et al. | |
| 2015/0263097 A1 | 9/2015 | Cheng et al. | |
| 2015/0318381 A1 | 11/2015 | Tsai et al. | |
| 2017/0141227 A1 | 5/2017 | Jacob | |
| 2017/0288056 A1 | 10/2017 | Balakrishnan et al. | |
| 2018/0355213 A1 | 12/2018 | Park et al. | |
| 2019/0385677 A1 | 12/2019 | Pillarisetty et al. | |
| 2020/0075330 A1 | 3/2020 | Chavan et al. | |
| 2020/0075713 A1 | 3/2020 | Mutch et al. | |
| 2020/0075732 A1 | 3/2020 | Mutch et al. | |

FOREIGN PATENT DOCUMENTS

| | | |
|---|---|---|
| CN | 1503327 A | 6/2004 |
| CN | 1720356 A | 1/2006 |
| CN | 1892984 A | 1/2007 |
| CN | 101421837 A | 4/2009 |
| CN | 104064448 A | 9/2014 |
| CN | 106415868 A | 2/2017 |
| EP | 2138609 A1 | 12/2009 |

* cited by examiner

DEVICES COMPRISING CRYSTALLINE MATERIALS

CROSS-REFERENCE TO RELATED APPLICATIONS

This application is a continuation of U.S. patent application Ser. No. 16/898,029, filed Jun. 10, 2020, now U.S. Pat. No. 11,532,699, issued Dec. 20, 2022, which is a divisional of U.S. patent application Ser. No. 16/121,966, filed Sep. 5, 2018, now U.S. Pat. No. 10,707,298, issued Jul. 7, 2020, the subject matter of which is related to the subject matter of U.S. patent application Ser. No. 16/121,928, "Semiconductor Structures, Memory Devices, and Systems, and Methods of Forming Same," filed Sep. 5, 2018, and U.S. patent application Ser. No. 16/122,004, "Semiconductor Structures, Memory Devices, and Systems, and Methods of Forming Same," filed Sep. 5, 2018, the disclosure of each of which is incorporated herein in its entirety by reference.

FIELD

Embodiments of the disclosure relate to the field of semiconductor device design and fabrication. More specifically, embodiments of the present disclosure relate to semiconductor structures, such as transistors comprising crystalline materials, memory devices, and electronic systems comprising the semiconductor structures, and to methods of forming the semiconductor structures.

BACKGROUND

Solid phase crystallization (SPC) and solid phase epitaxy (SPE) are conventionally used to form Si, SiGe, and Ge films for solid state electronics. However, controlling grain growth can be a problem for process integration because grain boundaries may occur in unwanted locations, which limit device performance and reliability.

In SPC, a film of homogeneous amorphous material is formed having a uniform crystallization temperature ($T_c$). Upon heating to a temperature above the $T_c$, nucleation occurs at random locations throughout the film, and the material crystallizes starting at the nucleation sites. Eventually, grain boundaries form at interfaces where different crystalline structures meet. These grain boundaries may occur randomly throughout the film.

In SPE, a film stack is formed having sections of material having varying crystallization temperatures. As the stack is heated above the $T_c$ of one section, crystallization begins. The material with a lower $T_c$ can "seed" crystallization of the material with the higher $T_c$. The benefit of this method is that crystallization can be performed at a relatively lower temperature. However, this method may also cause the formation of grain boundaries at undesired locations. For example, if a lower-$T_c$ material is above and below a higher-$T_c$ material, a grain boundary typically forms within the higher-$T_c$ material as the higher-$T_c$ material crystallizes from both sides. The grain boundary is generally nonplanar due to random orientation of grains within the different lower-$T_c$ materials. Such grain boundaries may limit the use of these materials in certain applications, such as vertical thin-film transistors (TFTs).

DETAILED DESCRIPTION

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical"

direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, at least 99.9% met, or even 100.0% met.

As used herein, the term "about" in reference to a given parameter is inclusive of the stated value and has the meaning dictated by the context (e.g., it includes the degree of error associated with measurement of the given parameter).

Figure 1:
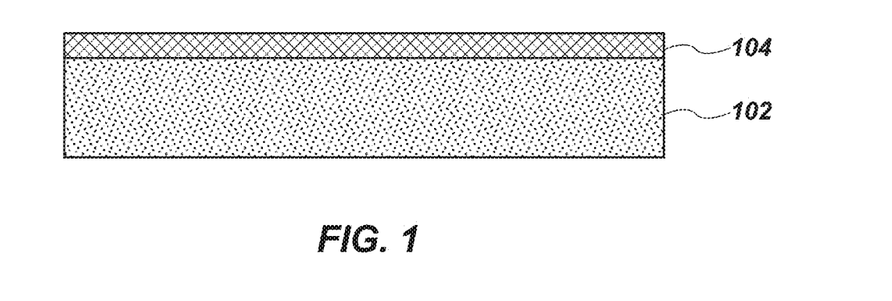
FIG. 1 is a simplified cross-sectional view illustrating a structure formed by a method according to embodiments of the disclosure.

FIG. 1 is a simplified cross-sectional view illustrating a first material 102 over which a blocking material 104 is formed. The first material 102 may be or include Si, Ge, or Si and Ge in any ratio (i.e., $Si_{1-x}Ge_x$, where x is between 0 and 1), and optionally, one or more dopants, and may be amorphous. The first material 102 may be formed by any of the methods described below. Also as described below, the first material 102 may exhibit a lower crystallization temperature than the crystallization temperature of some other materials.

The blocking material 104 may be or include an oxide, a nitride, a carbon-containing material, or another material (e.g., a material that traps a limited amount of charge), and may exhibit a high dielectric constant (k) or relative permittivity. For example, the blocking material 104 may have a dielectric constant from about 1 to about 100. The blocking material 104 may include, but is not limited to, a carbon film, $Al_2O_3$, $ZrO_x$, $SiO_2$, SiN, etc. In some embodiments, the blocking material 104 is $SiO_2$. The blocking material 104 is selected to exhibit a higher crystallization temperature than that of the first material 102. To tailor the crystallization temperature, the blocking material 104 may optionally be doped, such as with carbon, oxygen, nitrogen, or a combination thereof.

The blocking material 104 may, for example, be formed by one or more of a growth process and a deposition process. In certain embodiments, the blocking material 104 may be formed by oxidizing a surface of the first material 102. The blocking material 104 may be formed over the first material 102 as a continuous material or may be a discontinuous material. The blocking material 104 may be formed at a thickness of between about 1 Å and about 50 Å. If the blocking material 104 is formed as a continuous material, the blocking material 104 may be formed at a thickness sufficient to form the continuous material and enable electrical current to pass therethrough. As described below, the blocking material 104 forms an interfacial barrier between materials to prevent growth fronts from diffusing between the materials.

Figure 2:
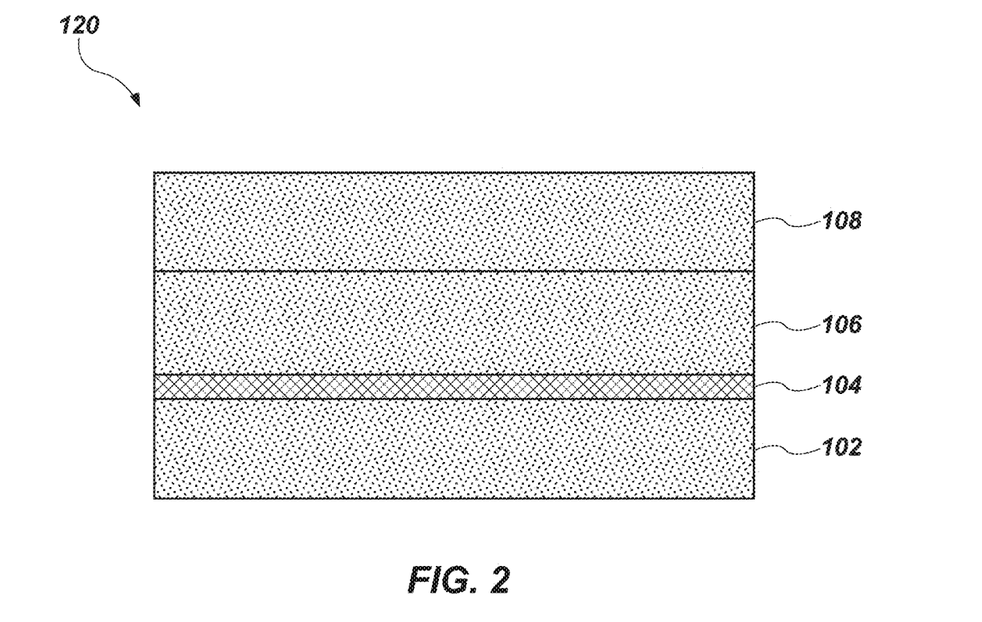
FIG. 2 is a simplified cross-sectional view illustrating the structure of FIG. 1, on which additional material has been added according to embodiments of the disclosure.

As shown in FIG. 2, a second material 106 may be formed over the blocking material 104. The second material 106 may be formed on or over the blocking material 104 using one or more of a growth process and a deposition process. By way of non-limiting example, the second material 106 may be formed on or over the blocking material 104 using one or more of an in-situ growth process, a physical vapor deposition ("PVD") process, a chemical vapor deposition ("CVD") process, a metallorganic chemical vapor deposition ("MOCVD") process, a plasma-enhanced chemical vapor deposition (PECVD) process, an atomic layer deposition ("ALD") process, a spin-coating process, and a blanket coating process. In-situ growth processes include, but are not limited to, epitaxial growth processes, such as atomic layer epitaxy (ALE), pulsed atomic layer epitaxy (PALE), molecular beam epitaxy (MBE), gas source MBE, organometallic MBE, and chemical beam epitaxy (CBE). PVD processes include, but are not limited to, one or more of sputtering, evaporation, and ionized PVD. The process utilized to form the second material 106 on or over the blocking material 104 may at least partially depend on the material properties of the second material 106 and the blocking material 104. The second material 106 may exhibit a higher crystallization temperature than the crystallization temperature of the first material 102.

In some embodiments, the first material 102 with the blocking material 104 thereon may be placed in a vacuum chamber and maintained at a deposition temperature (e.g., less than about 600° C., less than about 500° C., etc.) to form the second material 106. One or more gaseous precursors to the second material 106 may be provided to the vacuum chamber, and may react at the exposed surface of the blocking material 104 to form the second material 106. The second material 106 may have a different composition from the composition of the first material 102. The second material 106 may be or include Si, Ge, or Si and Ge in any ratio (i.e., $Si_{1-x}Ge_x$, where x is between 0 and 1), and optionally, one or more dopants, and may be amorphous.

The second material 106 may have a thickness up to about 10 μm, such as between about 25 Å and about 5 μm, or between about 100 Å and 1,000 Å (1 μm).

Also as shown in FIG. 2, a third material 108 may be formed over the second material 106 to form a structure 120. The third material 108 may be in an amorphous form, and may be or include Si, Ge, or Si and Ge in any ratio (i.e., $Si_{1-x}Ge_x$, where x is between 0 and 1), and optionally, one or more dopants. The third material 108 may be formed by methods described above with respect to the second material 106. The third material 108 may have the same composition as the first material 102, or may have a different composition. The third material 108 exhibits a crystallization temperature (i.e., the temperature at which a phase transition from amorphous to crystalline begins) lower than a crystallization temperature of the second material 106. The crystallization temperature of the third material 108 may be the same as, lower than, or higher than the crystallization temperature of the first material 102. Furthermore, the crystallization temperature of the second material 106 may be the same as, lower than, or higher than the crystallization temperature of the first material 102.

Figure 3:
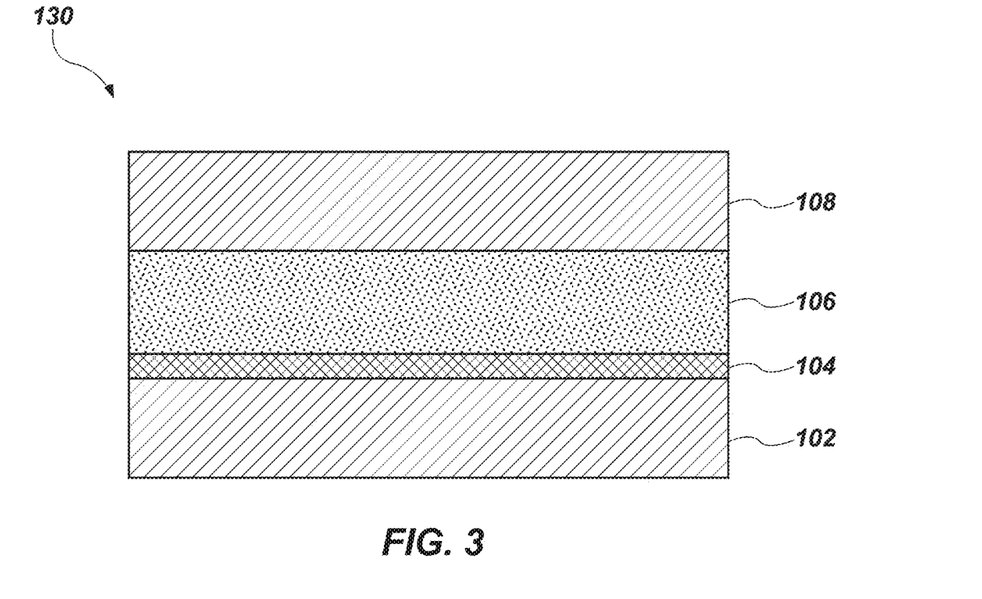
FIG. 3 is a simplified cross-sectional view illustrating the structure of FIG. 2, after annealing for a period of time in a method according to embodiments of the disclosure.

The structure 120 shown in FIG. 2 may be exposed to a temperature (e.g., an anneal temperature) above the crystallization temperature of the third material 108 and below the crystallization temperature of the second material 106 to form the structure 130 shown in FIG. 3. In some embodiments, the temperature may also be above the crystallization temperature of the first material 102. The structure 120 may be heated (e.g., annealed) for an amount of time sufficient for the first material 102 and the third material 108 to convert from amorphous to a substantially crystalline form while the second material 106 remains in the amorphous form.

Figure 4:
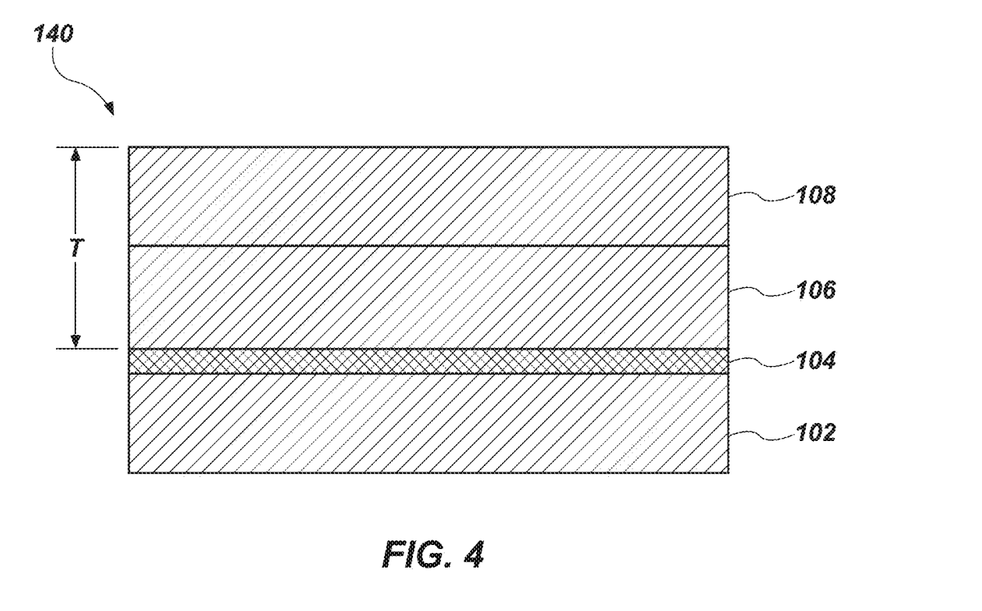
FIG. 4 is a simplified cross-sectional view illustrating the structure of FIG. 3, after annealing for an additional time, according to embodiments of the disclosure.

Continued annealing at the same anneal temperature may form the semiconductor structure 140 shown in FIG. 4, where the second material 106 is converted from amorphous to a substantially crystalline form. Without being bound by any theory, it is believed that the crystalline structure of the third material 108 causes the second material 106 to crystallize at the annealing temperature (i.e., below the crystallization temperature of the second material 106) by "seeding" or functioning as a template from which the second material 106 can form a crystalline structure without forming a grain boundary within the second material 106. Thus, the crystalline structure of the third material 108 may propagate into and through the second material 106 although the crystallization temperature of the second material 106 is higher than the anneal temperature. The blocking material 104 prevents the crystalline structure of the first material 102 from propagating to the second material 106 and prevents a grain boundary from forming in the center of the second material 106. Therefore, the second material 106 may form a continuous crystalline structure with the third material 108, and may not form an interface or break within the crystalline structure of the second material 106. That is, the second material 106 may exhibit a crystalline structure (e.g., structure and orientation) influenced by the "seeding" of the third material 108, but independent of material the first material 102. In some embodiments, the first material 102 may have a different crystalline structure than the second material 106 and the third material 108 (e.g., a different orientation).

In some embodiments, the crystallization temperature of the second material 106 may be the lower than the crystallization temperature of the third material 108. In such embodiments, the second material 106 may crystallize first and may seed crystallization of the third material 108.

The first material 102, the second material 106, and/or the third material 108 may each independently be doped with a dopant, for example, with boron, phosphorus, arsenic, another element, or a combination thereof. Such dopants may be provided as the materials 102, 106, 108 are formed, or may be implanted later. A higher dopant concentration tends to cause a lower crystallization temperature of materials otherwise having the same composition. Therefore, in one example, the first material 102 and the third material 108 may be doped, and the second material 106 may be undoped.

Accordingly, a method includes forming a semiconductor structure that includes a first material, a blocking material, a second material in an amorphous form, and a third material in an amorphous form. The blocking material is disposed between the first material and the second material. At least the second material and the third material each comprise at least one element selected from the group consisting of silicon and germanium. The structure is exposed to a temperature above a crystallization temperature of the third material and below a crystallization temperature of the second material.

Accordingly, certain methods include forming a blocking material over a first material, forming a second material in an amorphous form over the blocking material, and forming a third material in an amorphous form over the second material. The first material, the second material, and the third material each include at least one element selected from the group consisting of silicon and germanium. The second material exhibits a crystallization temperature higher than crystallization temperatures of both the first material and the third material. The first material, the blocking material, the second material, and the third material are exposed to a temperature above the crystallization temperatures of both the first material and the third material and below the crystallization temperature of the second material.

Accordingly, other methods include annealing a structure comprising a first material, a blocking material, a second material in an amorphous form, and a third material in an amorphous form at a temperature above crystallization temperatures of both the first material and the third material and below a crystallization temperature of the second material. The first material, the second material, and the third material each comprise at least one element selected from the group consisting of silicon and germanium. The blocking material is between the first material and the second material. The second material is between the blocking material and the third material.

The methods disclosed herein may be used to form the semiconductor structure 140 having a substantially continuous crystalline material (i.e., the materials 106 and 108) having a thickness T of at least about 100 Å over the blocking material 104. The thickness T may be greater than a thickness at which the material can be conventionally formed entirely in crystalline form at the annealing temperature. For example, the material may have a thickness of at least about 600 Å, at least about 1,000 Å, or even up to 10 μm. Crystalline materials of such thicknesses may be difficult or impossible to produce reliably at temperatures that do not damage certain electronic components (e.g., temperatures of 600° C. or less). The semiconductor structure 140 formed as described above may be substantially free of amorphous silicon and germanium. Furthermore, the second material 106 may be free of a grain boundary within the second material 106 (though the interface between the second material 106 and the blocking material 104 may be defined as a grain boundary) and may, therefore, be more suitable for applications in which a single crystalline material is beneficial.

Thus, the semiconductor structure 140 may be utilized as a transistor (e.g., a vertical thin-film transistor (TFT)) that exhibits uniformity of crystalline structure throughout its thickness. The semiconductor structure 140 may be patterned by conventional techniques to form a transistor that includes a channel region, and a source region and a drain region coupled to the channel region, with the transistor exhibiting a uniform crystalline structure. Thus, the transistor may be substantially free of grain boundaries, especially in its channel region.

Accordingly, in some embodiments, a semiconductor structure includes a first crystalline material, a blocking material over the first crystalline material, a second crystalline material over the blocking material, and a third crystalline material over the second crystalline material. The first, second, and third crystalline materials each include at least one element selected from the group consisting of silicon and germanium. The second crystalline material and the third crystalline material together define a continuous crystalline structure.

Figure 5:
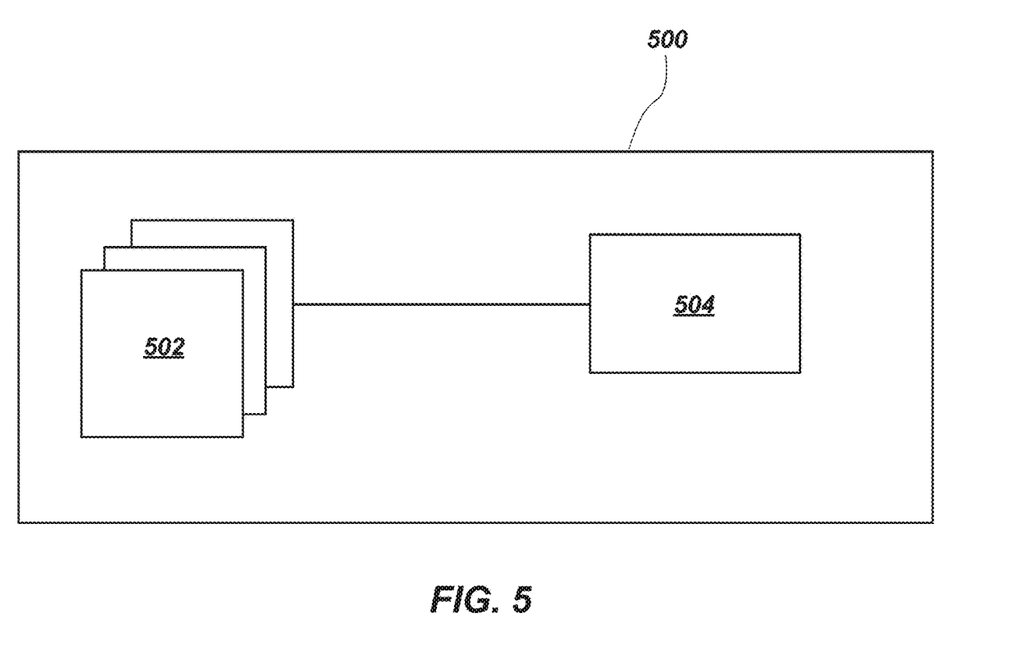
FIG. 5 is a functional block diagram of a memory device including a memory array comprising transistors in accordance with embodiments of the disclosure.

FIG. 5 illustrates a simplified block diagram of a memory device 500 in accordance with embodiments of the disclosure. The memory device 500 includes at least one memory cell having at least one semiconductor structure (e.g., the semiconductor structure 140 shown in FIG. 4) according to embodiments of the disclosure, as described above, in operative communication with a storage element. The semiconductor structure 140 may include a vertical TFT that acts as a switch for enabling and disabling current flow through the memory cell. The memory device 500 includes a memory array 502 comprising the memory cells and a control logic component 504. The memory array 502 may include multiple memory cells including the at least one semiconductor structure 140 according to embodiments of the disclosure. The control logic component 504 may be configured to operatively interact with the memory array 502 so as to read, write, or refresh any or all memory cells within the memory array 502. The memory device 500 including the semiconductor structure 140 may be formed by conducting additional process acts, which are not described in detail herein.

The semiconductor structure 140 (FIG. 4) or portions thereof may be incorporated in memory structures, memory cells, arrays including the memory cells, memory devices, switching devices, other semiconductor devices including the arrays, and systems including the arrays by conventional techniques. Embodiments of the semiconductor structure 140 may be used in a variety of memory cells (e.g., volatile memory, non-volatile memory) and/or transistor configurations. Non-limiting examples include random-access memory (RAM), read-only memory (ROM), dynamic random-access memory (DRAM), three-dimensional (3D) DRAM, NAND, synchronous dynamic random-access memory (SDRAM), flash memory, resistive random-access memory (ReRAM), conductive bridge random-access memory (conductive bridge RAM), magnetoresistive random-access memory (MRAM), phase change material (PCM) memory, phase change random-access memory (PCRAM), spin-torque-transfer random-access memory (STTRAM), oxygen vacancy-based memory, programmable conductor memory, ferroelectric random-access memory (FE-RAM), reference field-effect transistors (RE-FET), etc.

Figure 6:
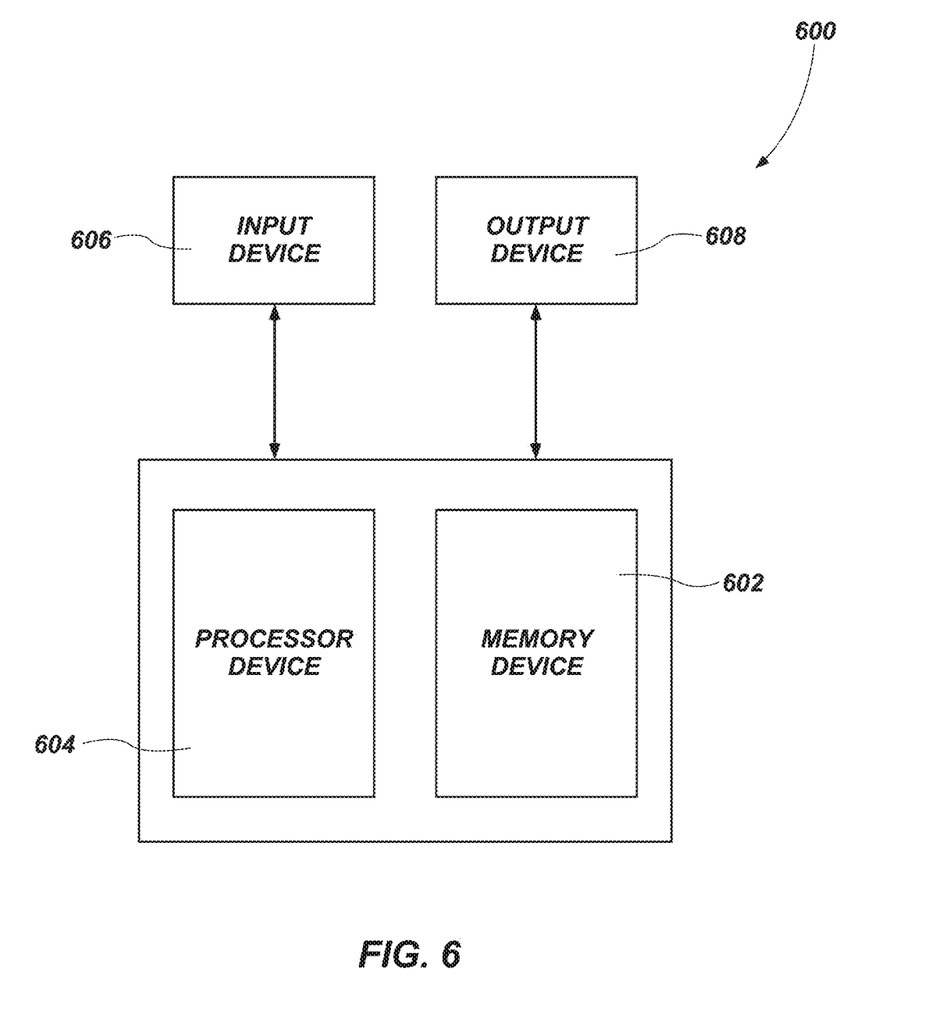
FIG. 6 is a schematic block diagram illustrating an electronic system including semiconductor devices comprising at least one transistor in accordance with embodiments of the disclosure.

Memory devices 500 including the semiconductor structure 140 formed in accordance with embodiments of the disclosure may be formed by conducting additional process acts, which are not described in detail herein. The memory devices 500 may be used in an electronic system 600 as shown in FIG. 6. The electronic system 600 may comprise, for example, a computer or computer hardware component, a server or other networking hardware component, a cellular telephone, a digital camera, a personal digital assistant (PDA), a portable media (e.g., music) player, a Wi-Fi or cellular-enabled tablet such as, for example, an iPad® or SURFACE® tablet, an electronic book, a navigation device, etc. The electronic system 600 includes at least one memory device 602, which includes at least one semiconductor device including memory cells having at least one semiconductor structure (e.g., a vertical TFT) as previously described. The electronic system 600 may further include at least one electronic signal processor device 604 (often referred to as a "microprocessor"). The electronic signal processor device 604 may, optionally, include at least one semiconductor structure as previously described. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, a monitor, a display, a printer, an audio output jack, a speaker, etc. In some embodiments, the input device 606 and the output device 608 may comprise a single touchscreen device that can be used both to input information to the electronic system 600 and to output visual information to a user. The one or more input devices 606 and output devices 608 may communicate electrically with at least one of the memory device 602 and the electronic signal processor device 604.

Accordingly, a memory device is disclosed, which includes at least one thin-film transistor and a storage element in operative communication with the at least one thin-film transistor. The at least one thin-film transistor includes a first crystalline material, a second crystalline material over the first crystalline material, and a third crystalline material over the second crystalline material. The first, second, and third crystalline materials each include at least one element selected from the group consisting of silicon and germanium. A blocking material separates the first crystalline material from the second crystalline material. The second crystalline material and the third crystalline material together define a continuous crystalline structure. In some embodiments, the blocking material may separate the second crystalline material from the third crystalline material, rather than from the first crystalline material. In such embodiments, the second crystalline material and the first crystalline material together define a continuous crystalline structure.

Furthermore, a system is disclosed that, in some embodiments, includes memory comprising memory cells comprising at least one vertical thin-film transistor and a processor in operative communication with at least one input device, at least one output device, and the at least one memory cell. The at least one vertical thin-film transistor comprises a first crystalline material, a blocking material over the first crystalline material, and a substantially continuous crystalline material over the blocking material. The substantially continuous crystalline material comprises a second crystalline material and a third crystalline material. The first crystalline material, the second crystalline material, and the third crystalline material each comprise at least one element selected from the group consisting of silicon and germanium. The system further includes a processor in operative communication with at least one input device, at least one output device, and the memory.

The following examples serve to explain embodiments of the invention in more detail. These examples are not to be construed as being exhaustive or exclusive as to the scope of this invention.

EXAMPLES

Example 1

Solid Phase Crystallization of a Three-Layer SiGe Stack with a Barrier

An oxide material was formed over an amorphous, phosphorus-doped $Si_{0.2}Ge_{0.8}$ substrate having a thickness of about 250 Å. An undoped amorphous SiGe material having a molar ratio of about 1 mole Si to 1 mole Ge (i.e., SiGe) was formed over the oxide material at a thickness of about 600 Å. An undoped $Si_{0.2}Ge_{0.8}$ material was formed over the oxide material at a thickness of about 250 Å.

Figure 7:
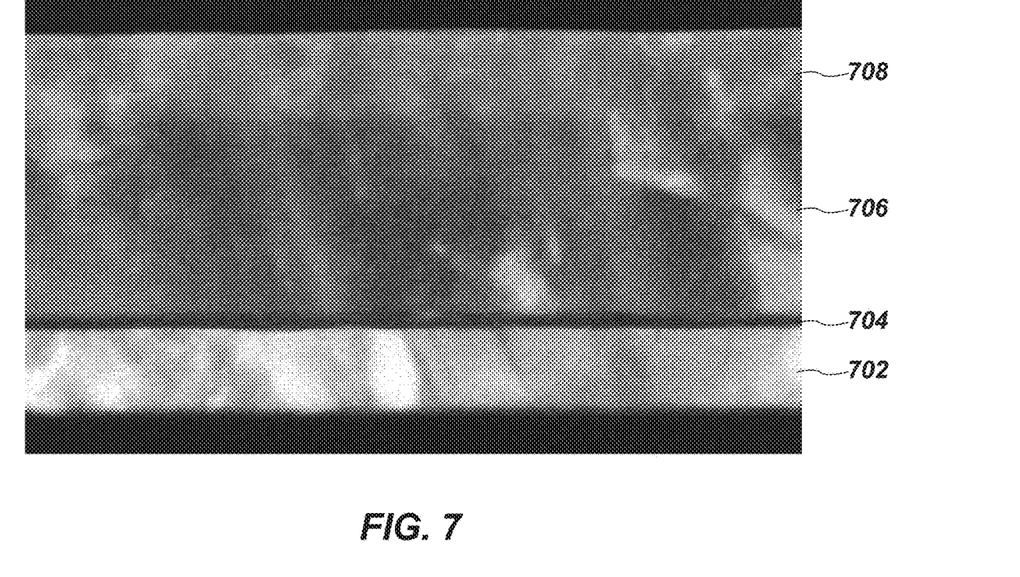
FIG. 7 is an image obtained via scanning transmission electron microscopy (STEM) of a cross-section of a structure formed according to embodiments of the disclosure.
Figure 8:
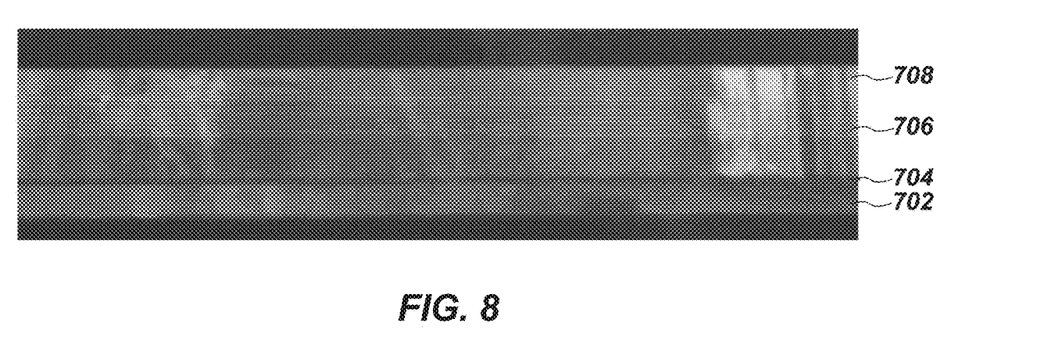
FIG. 8 is an image obtained via STEM of a larger cross-section of the structure shown in FIG. 7.

The structure was placed in a chamber and annealed in a nonoxidizing environment at 600° C., a temperature higher than the crystallization temperature of $Si_{0.2}Ge_{0.8}$ but lower than the crystallization temperature of SiGe. FIG. 7 shows an image obtained via scanning transmission electron microscopy (STEM) of a cross-section of the structure. The $Si_{0.2}Ge_{0.8}$ substrate 702 appears near the bottom of the image, with the oxide material 704, the SiGe material 706, and the $Si_{0.2}Ge_{0.8}$ material 708 thereon. The crystalline structure of the materials 706 and 708 appears to be continuous. FIG. 8 shows a cross-section of a larger portion of the structure, and shows different crystalline structures in different areas (e.g., at the left of the image, at the center of the image, and at the right of the image), yet the crystalline structures appear continuous between the materials 706 and 708.

Without being bound to any particular theory, it appears that substrate 702 and the top $Si_{0.2}Ge_{0.8}$ material 708 each crystallized before the SiGe material 706. Once the material 708 crystallized, the SiGe material 706 began to crystallize at a temperature below its crystallization temperature using the top material 708 as a template. The crystalline structure of the wafer 702 appeared to have no effect on the crystalline structure of the SiGe material 706.

Comparative Example 2

Solid Phase Crystallization of a Three-Layer SiGe Stack without a Barrier

A substrate of amorphous, phosphorus-doped $Si_{0.2}Ge_{0.8}$ having a thickness of about 250 Å was formed. An undoped amorphous SiGe material having a molar ratio of about 1 mole Si to 1 mole Ge (i.e., SiGe) was formed directly over the amorphous $Si_{0.2}Ge_{0.8}$ (i.e., without first forming an oxide layer) at a thickness of about 600 Å. An undoped $Si_{0.2}Ge_{0.8}$ material was formed over the undoped amorphous SiGe material at a thickness of about 250 Å.

Figure 9:
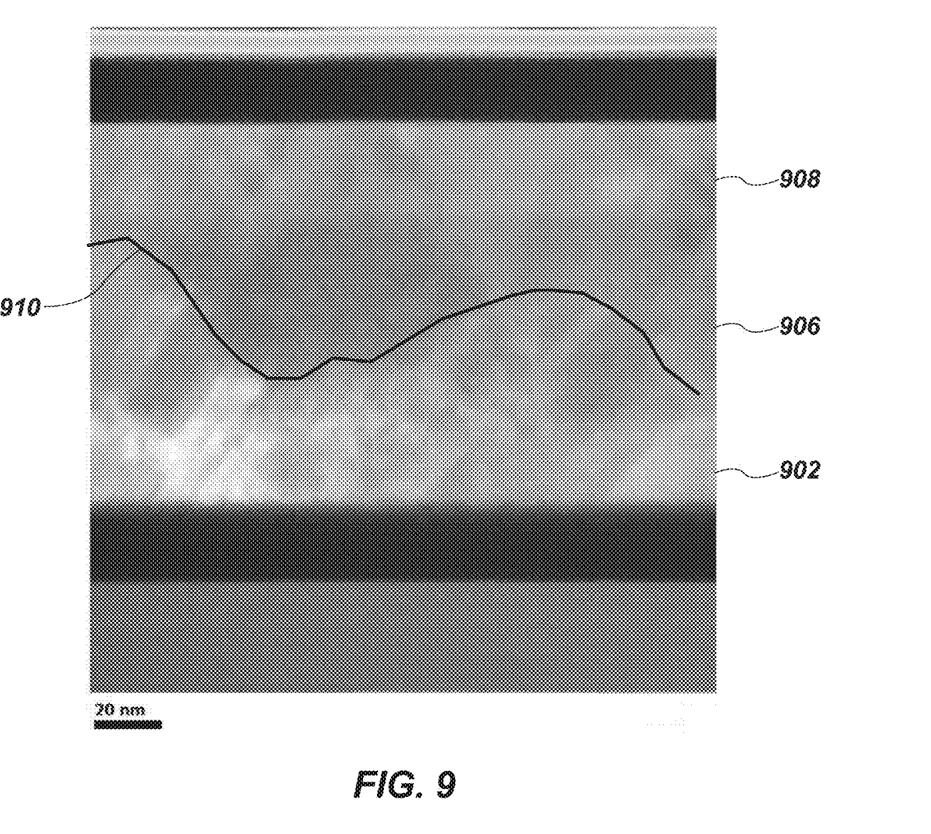
FIG. 9 is an image obtained via STEM of a cross-section of a structure formed by conventional methods.

The structure was placed in a chamber and annealed in a nonoxidizing environment at 600° C., a temperature higher than the crystallization temperature of $Si_{0.2}Ge_{0.8}$ but lower than the crystallization temperature of SiGe. FIG. 9 shows an image obtained via STEM of a cross-section of the structure. The substrate 902 appears near the bottom of the image, with the SiGe material 906 and the $Si_{0.2}Ge_{0.8}$ material 908 thereon. The crystalline structure of the material 906 appears to have formed a discontinuity along a grain boundary 910. That is, the bottom portion of the SiGe material 906 below the grain boundary 910 appears to exhibit a similar crystalline structure to that of the substrate 902, and the top portion of the SiGe material 906 above the grain boundary 910 appears to exhibit a similar crystalline structure to that of the material 908. The grain boundary 910 appears to be non-planar (i.e., nonlinear in the cross-sectional view of FIG. 9).

Without being bound to any particular theory, it appears that the substrate 902 and the top $Si_{0.2}Ge_{0.8}$ material 908 each crystallized before the SiGe material 906. The SiGe material 906 began to crystallize below its crystallization temperature using both the top material 908 and the substrate 902 as templates. The crystallization fronts met within the SiGe material 906 at the grain boundary 910.

The presence of the grain boundary 910 and its non-planar shape may cause variability in the electrical performance of the structure, and, when used in a device such as a vertical TFT, may cause electrical performance and reliability issues.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
   a first crystalline material;
   a blocking material adjacent to the first crystalline material; and
   a substantially continuous crystalline material adjacent to the blocking material, the substantially continuous crystalline material comprising a second crystalline material and a third crystalline material, a crystallization temperature of the third crystalline material being lower than the crystallization temperature of the second crystalline material.

2. The device of claim 1, wherein the crystallization temperature of the third crystalline material is the same as a crystallization temperature of the first crystalline material.

3. The device of claim 1, wherein the crystallization temperature of the third crystalline material is lower than a crystallization temperature of the first crystalline material.

4. The device of claim 1, wherein the crystallization temperature of the second crystalline material is lower than a crystallization temperature of the first crystalline material.

5. A device, comprising:
   a first crystalline material;
   a blocking material adjacent to the first crystalline material; and
   a substantially continuous crystalline material adjacent to the blocking material, the substantially continuous crystalline material comprising a second crystalline material and a third crystalline material, a crystallization temperature of the second crystalline material being lower than a crystallization temperature of the third crystalline material.

6. The device of claim 1, wherein the crystallization temperature of the second crystalline material is the same as the crystallization temperature of the first crystalline material.

7. The device of claim 6, wherein each of the first crystalline material, the second crystalline material, and the third crystalline material comprises a dopant.

8. The device of claim 1, wherein the blocking material has a thickness of between about 1 Å and about 50 Å.

9. A device, comprising:
   a first crystalline material, the first crystalline material being a doped material;
   a second material in a substantially crystalline form and adjacent to the first crystalline material, the second material being an undoped material;
   a blocking material between the first crystalline material and the second material; and
   a third material in a substantially crystalline form, the third material adjacent to the second material and a chemical composition of the third material different from a chemical composition of the second material.

10. The device of claim 9, wherein the second material is between the blocking material and the third material.

11. The device of claim 9, wherein each of the first crystalline material, the second material, and the third material comprises one or more of silicon and germanium.

12. The device of claim 9, wherein the second material and the third material exhibit a combined thickness of at least about 100 Å.

13. The device of claim 9, wherein the second material and the third material comprise a continuous crystalline material.

14. The device of claim 13, wherein the first crystalline material, the second material, and the third material of the device are configured as a vertical thin-film transistor (TFT) and exhibit a uniform crystalline structure throughout a thickness thereof.

15. The device of claim 14, wherein the vertical TFT is substantially free of amorphous silicon and amorphous germanium.

16. A device, comprising:
a first crystalline material;
a blocking material over the first crystalline material; and
a substantially continuous crystalline material comprising a second material in a substantially continuous crystalline form over the blocking material and a third material in a substantially continuous crystalline form over the second material,
the first crystalline material, the second material, and the third material comprising one or more of silicon and germanium,
at least one of the first crystalline material and the third material being a doped material, and the second material being an undoped material.

17. The device of claim 16, wherein the second material and the third material exhibit a combined thickness of at least about 600 Å.

18. The device of claim 16, wherein the second material and the third material exhibit a combined thickness of at least about 1,000 Å.

19. The device of claim 16, wherein the second material and the third material lack an interface therebetween.

* * * * *